United States Patent
Chao et al.

(10) Patent No.: US 11,842,998 B2
(45) Date of Patent: Dec. 12, 2023

(54) SEMICONDUCTOR DEVICE AND METHOD OF FORMING THE SEMICONDUCTOR DEVICE

(71) Applicant: International Business Machines Corporation, Armonk, NY (US)

(72) Inventors: Robin Hsin Kuo Chao, Cohoes, NY (US); Hemanth Jagannathan, Niskayuna, NY (US); Choonghyun Lee, Rensselaer, NY (US); Chun Wing Yeung, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/731,210

(22) Filed: Dec. 31, 2019

(65) Prior Publication Data
US 2020/0152631 A1    May 14, 2020

Related U.S. Application Data

(63) Continuation of application No. 15/994,745, filed on May 31, 2018, now Pat. No. 10,541,239, which is a
(Continued)

(51) Int. Cl.
*H01L 27/092* (2006.01)
*H01L 29/165* (2006.01)
(Continued)

(52) U.S. Cl.
CPC .... *H01L 27/0924* (2013.01); *H01L 21/02532* (2013.01); *H01L 21/324* (2013.01); *H01L 21/823807* (2013.01); *H01L 21/823814* (2013.01); *H01L 21/823821* (2013.01); *H01L 21/823885* (2013.01); *H01L 29/1054* (2013.01);
(Continued)

(58) Field of Classification Search
CPC ............ H01L 29/1054; H01L 29/7847; H01L 29/7848
See application file for complete search history.

(56) References Cited

U.S. PATENT DOCUMENTS 7,993,999 B2    8/2011    Basker et al.
8,211,772 B2    7/2012    Kavalieros et al.
(Continued)

OTHER PUBLICATIONS

S. K. Wang et al., "Desorption Kinetics of GeO from GeO2/Ge Structure." Journal of Applied Physics, vol. 108, No. 5, 2010, 054104, 8 pages.
(Continued)

*Primary Examiner* — Xiaoming Liu
(74) *Attorney, Agent, or Firm* — Kimberly Zillig; McGinn I.P. Law Group, PLLC

(57) ABSTRACT

A semiconductor device includes a first diffusion region having a first conductivity type, a first SiGe fin formed on the first diffusion region, a second diffusion region having a second conductivity type, and a second SiGe fin formed on the second diffusion region and including a central portion including a first amount of Ge, and a surface portion including a second amount of Ge which is greater than the first amount. A total width of the central portion and the surface portion is substantially equal to a width of the second diffusion region.

20 Claims, 12 Drawing Sheets

Related U.S. Application Data continuation of application No. 15/279,154, filed on Sep. 28, 2016, now Pat. No. 10,079,233.

(51) Int. Cl.

| | | |
|---|---|---|
| *H01L 29/161* | (2006.01) | |
| *H01L 21/8238* | (2006.01) | |
| *H01L 21/02* | (2006.01) | |
| *H01L 21/324* | (2006.01) | |
| *H01L 29/10* | (2006.01) | |
| *H01L 29/78* | (2006.01) | |
| *H01L 29/66* | (2006.01) | |

(52) U.S. Cl.
CPC ......... *H01L 29/161* (2013.01); *H01L 29/165* (2013.01); *H01L 29/66666* (2013.01); *H01L 29/7827* (2013.01); *H01L 29/785* (2013.01)

(56) References Cited

U.S. PATENT DOCUMENTS

| | | | |
|---|---|---|---|
| 8,796,666 | B1 | 8/2014 | Huang et al. |
| 8,847,281 | B2 | 9/2014 | Cea et al. |
| 8,951,870 | B2 | 2/2015 | Basker et al. |
| 9,006,842 | B2 | 4/2015 | Colinge et al. |
| 9,171,715 | B2 | 10/2015 | Matero |
| 9,257,556 | B2 | 2/2016 | Xu et al. |
| 10,079,233 | B2 * | 9/2018 | Chao ............... H01L 21/823807 |
| 10,541,239 | B2 * | 1/2020 | Chao ................... H01L 29/7827 |
| 2005/0093076 | A1 * | 5/2005 | Steegen ........... H01L 21/26513 |
| | | | 257/369 |
| 2007/0221956 | A1 * | 9/2007 | Inaba ............. H01L 21/823878 |
| | | | 257/E21.633 |
| 2011/0147811 | A1 * | 6/2011 | Kavalieros ......... H01L 29/7851 |
| | | | 257/E21.409 |
| 2011/0147847 | A1 | 6/2011 | Cea |
| 2011/0260213 | A1 * | 10/2011 | Chan ................... H01L 29/7848 |
| | | | 257/190 |
| 2012/0269710 | A1 | 10/2012 | Li |
| 2014/0065841 | A1 | 3/2014 | Matero |
| 2014/0170839 | A1 * | 6/2014 | Brunco ............. H01L 29/66818 |
| | | | 438/479 |
| 2015/0194525 | A1 | 7/2015 | Xu |
| 2015/0340228 | A1 | 11/2015 | Tapily |

OTHER PUBLICATIONS

J. Franco et al., "NBTI in Si 0.55 Ge 0.45 Cladding p-FinFETs: Porting the Superior Reliability from Planar to 3D Architectures," International Reliability Physics Symposium, 2015, 5 pages.

* cited by examiner

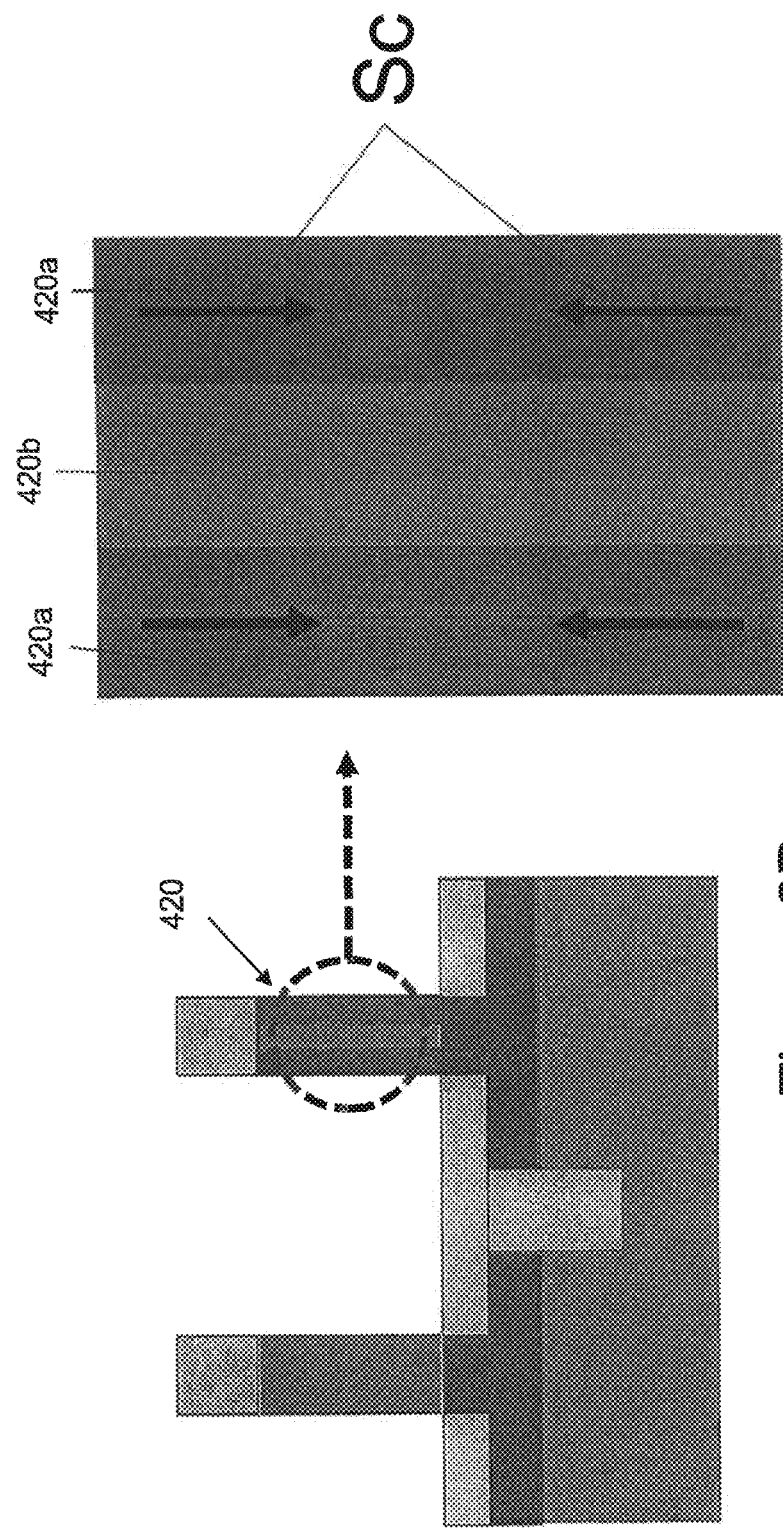

SEMICONDUCTOR DEVICE AND METHOD OF FORMING THE SEMICONDUCTOR DEVICE

RELATED APPLICATIONS

The present Application is a Continuation Application of U.S. patent application Ser. No. 15/994,745, which was filed on May 31, 2018, which is the Divisional Application of U.S. patent application Ser. No. 15/279,154, which was filed on Sep. 28, 2016, now (U.S. Pat. No. 10,079,233).

BACKGROUND

The present invention relates generally to a semiconductor device and method of forming a semiconductor device, and more particularly, a method of forming a semiconductor device which includes performing an anneal to react a germanium-containing layer with a surface of a SiGe fin.

Vertical transport FETs (VFET) have potential advantages over conventional FinFETs in terms of density, performance, power consumption, and integration. First, the VFET provides for better density and allows scaling to sub-30 nm contacted poly pitch (CPP). Further, no diffusion break is required between devices, and nested devices have very high effective current (Ieff) density and low capacitance.

Second, the VFET provides for higher performance and/or lower power. The VFET provides for faster devices due to higher Ieff and also supports higher Vmax. Further, Lgate length is not limited by CPP so better device Ion v. Ioff. The Lgate may be about 15 nm, and can be longer or shorter if desired. Further, capacitance may be about comparable for isolated FETs, and VFET capacitance is lower for multi-finger devices than lateral FETs. The VFET also eliminates finFET width quantization (saves power by not over-sizing device width), has a large bottom S/D region to reduce lateral resistance, and a lower trench silicide (TS) resistance by eliminating top S/D TS. Further, FETs in series fins can avoid TS on both source and drain Third, the VFET provides improved manufacturability and scaling. The VFET makes it easier to integrate multi-material stacked structures, provides TS to bottom S/D design flexibility, has a much lower aspect ratio for etch and fill, and provides better connectivity which allows relaxed TS, contact and MO features.

SUMMARY

An exemplary aspect of the present invention is directed to a method of forming a semiconductor device, includes forming first and second SiGe fins on a substrate, forming a protective layer on the first SiGe fin, forming a $GeO_2$ layer on the second SiGe fin and on the protective layer on the first SiGe fin, and performing an anneal to react the germanium-containing layer with a surface of the second SiGe fin.

Another exemplary aspect of the present invention is directed to a semiconductor device including a first SiGe fin formed on a substrate and including a first amount of Ge, and a second SiGe fin formed on a substrate and including a central portion including a second amount of Ge which is substantially equal to the first amount, and a surface portion including a third amount of Ge which is at least 20% greater than the second amount.

Another exemplary aspect of the present invention is directed to a method of forming a semiconductor device. The method includes forming a first SiGe fin on a substrate on an nFET side of the semiconductor device, the first SiGe fin including a first amount of Ge, forming a second SiGe fin on the substrate on a pFET side of the semiconductor device, the second SiGe fin including a second amount of Ge which is substantially equal to the first amount, forming an $SiO_2$ layer on the first SiGe fin, forming a germanium-containing layer on the second SiGe fin and on the protective layer on the first SiGe fin, and performing an anneal to react the germanium-containing layer with a surface of the second SiGe fin such that the surface of the second SiGe fin includes a third amount of Ge which is at least 20% greater than the second amount, a temperature of the anneal being no greater than 700° C., and the anneal being performed in a nitrogen ambient. After the performing of the anneal, the second SiGe fin includes a compressive strain in a vertical direction of at least 1 Gpa.

With its unique and novel features, the exemplary aspects of the present invention may provide a semiconductor device with a first SiGe fin having a tensile strain, and a second SiGe fin having a compressive strain in a vertical direction.

BRIEF DESCRIPTION OF THE DRAWINGS

The exemplary aspects of the present invention will be better understood from the following detailed description of the exemplary embodiments of the invention with reference to the drawings, in which:

FIG. 6B illustrates a detailed view of the SiGe fin 420 after the anneal, according to an exemplary aspect of the present invention.

DETAILED DESCRIPTION

Figure 1:
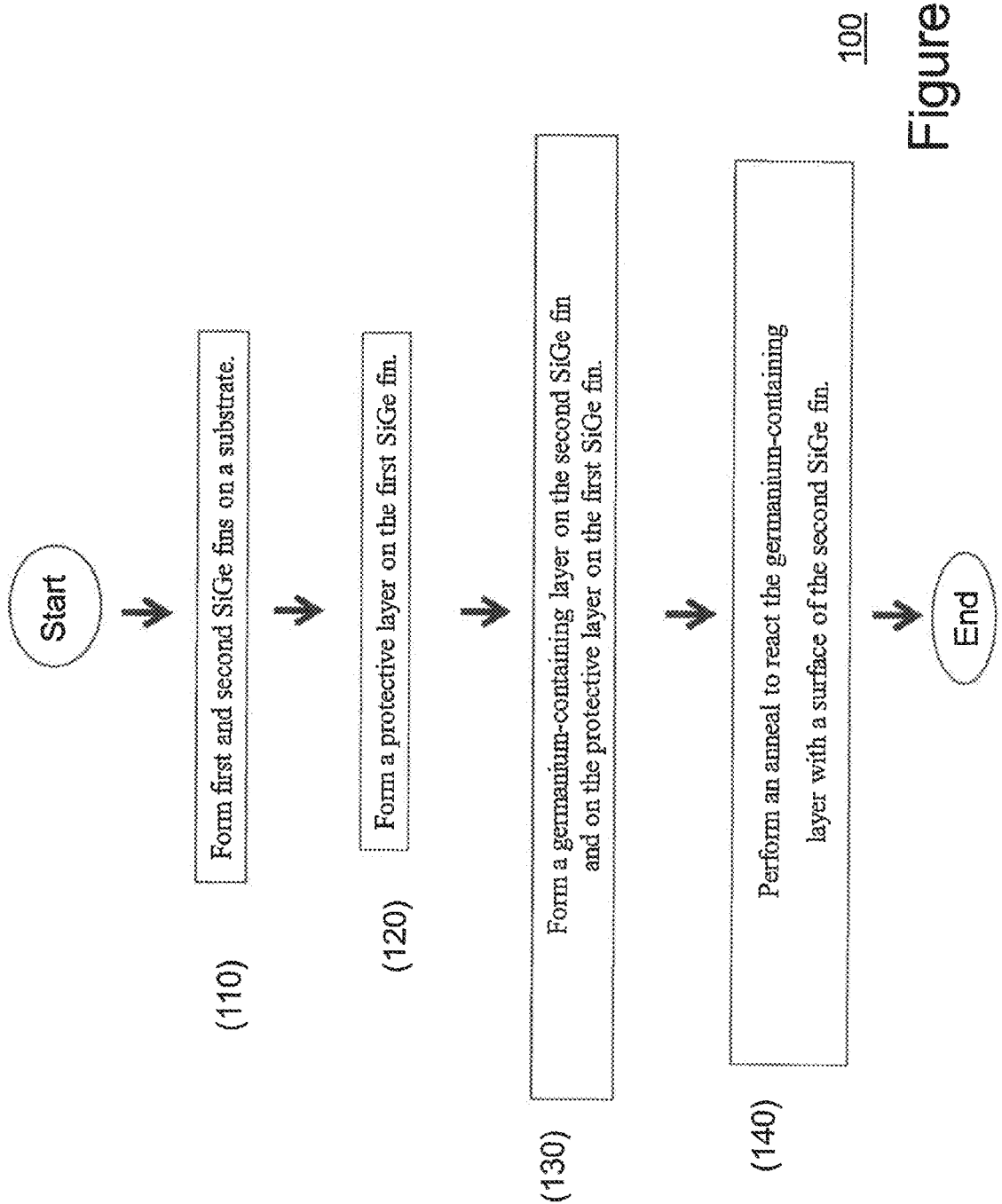
FIG. 1 illustrates a method 100 of forming a semiconductor device, according to an exemplary aspect of the present invention.

The invention will now be described with reference to FIGS. 1-4C, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

Related art VFETs have a problem. In particular, a SiGe channel is very attractive for a high performance FinFET structure due to the compressive strain along the sidewall channel direction. However, vertical channel direction will have the tensile strain, resulting in the degradation of SiGe vertical pFET performance.

Cladding epitaxial growth on the fin for strain engineering is not suitable due to surface roughness and orientation dependent growth rate, which leads to the variation of device performance.

There are no known arts to form vertical transistors (e.g., complementary metal oxide semiconductor (CMOS) transistors with tensile-strained and compressively-strained SiGe channels, because of difficulties in controlling the strain in a vertically standing SiGe channel on a silicon substrate.

An exemplary aspect of the present invention may address the problems of related art devices.

FIG. 1 illustrates a method 100 of forming a semiconductor device, according to an exemplary aspect of the present invention.

As illustrated in FIG. 1, the method 100 includes forming (110) first and second SiGe fins (e.g., an nFET fin and a pFET fin, respectively) on a substrate, forming (120) a protective layer (e.g., SiO$_2$) on the first SiGe fin, forming (130) a germanium-containing layer (e.g., a GeO$_2$ layer) on the second SiGe fin and on the protective layer on the first SiGe fin (e.g., depositing GeO$_2$ by atomic layer deposition (ALD)), and performing (140) an anneal to react the germanium-containing layer with a surface of the second SiGe fin.

The germanium-containing layer may include any layer that contains germanium (e.g., GeO$_2$) and may be reacted with the SiGe in the surface of the first and second SiGe fins so as to increase the ratio of germanium to silicon at the surface. The protective layer may include any layer (e.g., SiO$_2$) that can "protect" the SiGe fin by keeping the germanium-containing layer from reacting with the surface of the SiGe fin.

The method 100 may also include forming a bottom source/drain (S/D) region and a bottom spacer on the substrate. In this case, the first and second SiGe fins may be formed on the bottom S/D region.

Figure 2:
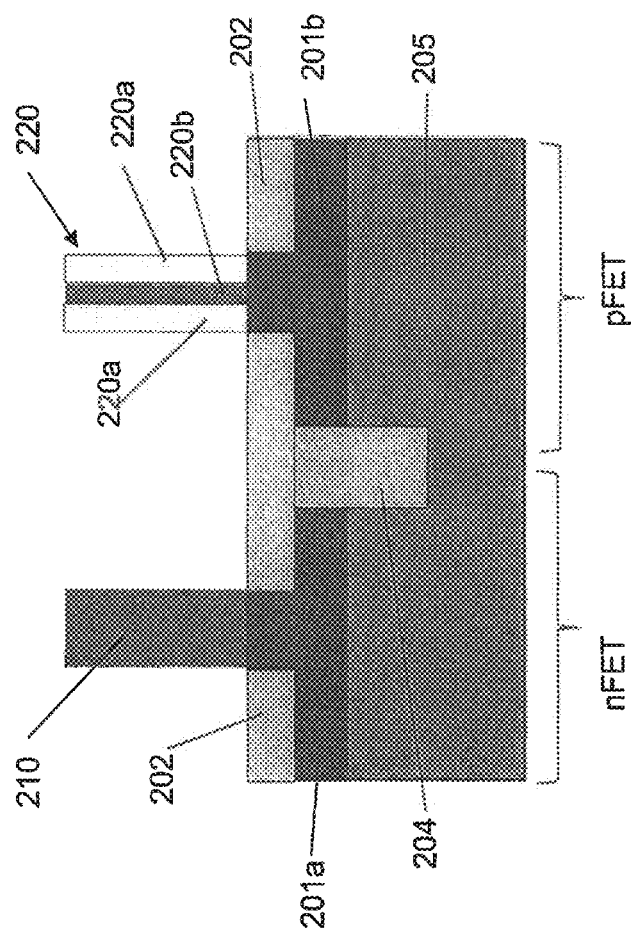
FIG. 2 illustrates a semiconductor device 200, according to an exemplary aspect of the present invention.

FIG. 2 illustrates a semiconductor device 200, according to an exemplary aspect of the present invention. The semiconductor device 200 may be made, for example, by using the method 100.

As illustrated in FIG. 2, the semiconductor device 200 includes a first SiGe fin 210 formed on a substrate 205 and including a first amount of Ge. The semiconductor device further includes a second SiGe fin 220 formed on the substrate and including a central portion 220b including a second amount of Ge which is substantially equal to the first amount, and a surface portion 220a including a third amount of Ge which is at least 20% greater than the second amount.

The first SiGe fin 201 may include a tensile strain, and the second SiGe fin 220 may include a compressive strain in a vertical direction of at least 1 Gpa.

The substrate 205 may include, for example, a semiconductor substrate such as a silicon substrate. The device 200 may include an nFET side and a pFET side which are separated by a shallow trench isolation (STI) 204. The first SiGe fin 210 may be formed on the nFET side on an n-type (e.g., n+) diffusion region 201a, and the second SiGe fin 220 may be formed on the pFET side on a p-type diffusion region 201b. The device 200 may also include a bottom spacer 202 formed on the substrate 205.

In particular, the surface portion of the second SiGe fin may include at least 40% Ge, and the central portion of the second SiGe fin may include no more than 20% Ge.

Further, a height of the first and second SiGe fins 210, 220 in a vertical direction may be in a range from 30 nm to 50 nm. The height of the first SiGe fin 210 in the vertical direction may be substantially equal to the height of the second SiGe fin 220 in the vertical direction.

The width of the first and second SiGe fins 210, 220 in a horizontal direction may be in a range from 5 nm to 20 nm. The width of the first SiGe fin 210 in the horizontal direction may be substantially equal to a width of the second SiGe fin 220 in the horizontal direction.

A thickness of the surface portion 220a may be substantially equal to a thickness of the central portion 220b. In particular, the thickness of the surface portion 220a may be in a range from 1 nm to 4 nm, and a thickness of the central portion 220b may be in a range from 1 nm to 4 nm.

A SiGe finFET may have 35% greater hole mobility than an Si finFET. That is, there is a clear mobility benefit of the SiGe finFET over the Si finFET, leading to chip level performance gain.

Figure 3:
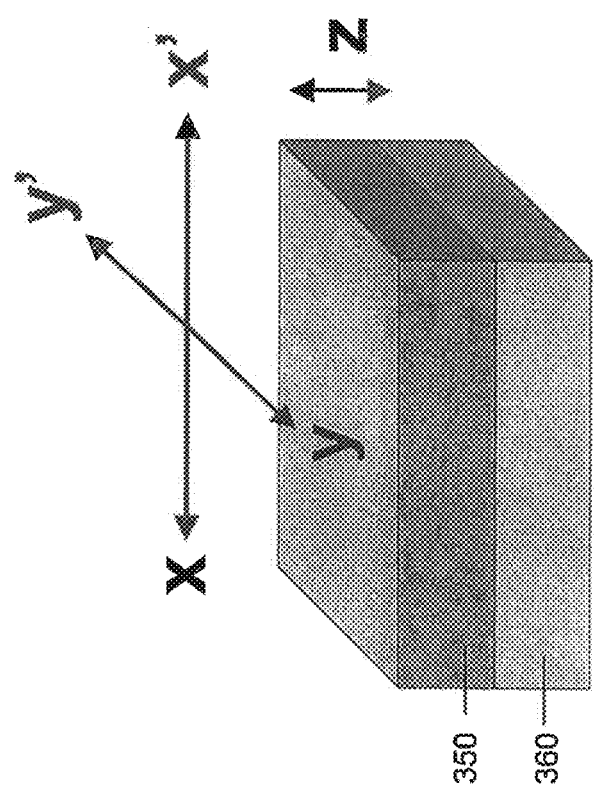
FIG. 3 illustrates a strain on a SiGe layer 350 (e.g., $Si_{1-x}Ge_x$) formed on a Si substrate 305, before being treated (e.g. by reacting with a germanium-containing layer), according to an exemplary aspect of the present invention.

FIG. 3 illustrates a strain on a SiGe layer 350 (e.g., $Si_{1-x}Ge_x$) formed on a Si substrate 305, before being treated (e.g. by reacting with a germanium-containing layer), according to an exemplary aspect of the present invention. A thickness of the SiGe layer 350 in a vertical direction (e.g., z-direction) may be, for example, in a range from 30 nm to 50 nm. The SiGe layer 350 may be patterned, for example, to form a SiGe fin (e.g., SiGe channel) of a VFET.

The SiGe layer 350 includes a compressive strain in the x-direction and the y-direction, and includes a tensile strain in the z-direction. Thus, at the time of patterning the SiGe layer 350 to form a VFET fin, the VFET fin (e.g., both the nFET fin and the pFET fin) will have a tensile strain along the vertical channel direction.

In a case where the VFET is a pFET, this tensile strain may result in a degradation of a performance of the pFET. That is, the current flow in the pair of SiGe vertical pFETs 300 is in a direction from the source region 301 to the drain regions 303, and therefore, a tensile strain in the vertical direction of the SiGe fin 320 (e.g., channel) (e.g., see FIG. 3) may impede the current flow and degrade a performance of the pair of SiGe vertical pFETs 300.

However, an exemplary aspect of the present invention may provide a method and process scheme for introducing compressive strain into a SiGe fin (e.g., a vertically standing SiGe channel), which may improve the hole mobility wherein the SiGe fin is a SiGe fin in a pFET. In particular, an exemplary aspect of the present invention may form the SiGe fin by depositing a germanium-containing layer (e.g., GeO$_2$ layer) on the SiGe fin (e.g., SiGe channel) of the pFET, and performing an anneal to have a selective Si oxidation on the SiGe fin at a relatively low temperature in an inert gas (e.g., nitrogen) ambient. After the anneal, a Ge-rich SiGe surface may be formed on a sidewall of the SiGe fin, resulting in a compressive strain (e.g., highly-compressive strain) being applied in the vertical channel direction of the pFET.

The exemplary aspect of the present invention may only modify the SiGe surface in the pFET. That is, the exemplary aspect of the present invention may not modify the SiGe surface in an nFET (e.g., where the semiconductor device is a complementary metal oxide semiconductor (CMOS) device).

Thus, the exemplary aspects of the present invention may provide a process scheme of channel strain engineering for a SiGe channel vertical CMOS. The channel material as deposited may include, for example, a low Ge content SiGe channel (e.g., SiGe20%). The strain may be to the vertical channel direction (for vertically transport devices) may be engineered by the exemplary aspects of the present invention, to provide a tensile-strained SiGe channel for a vertical nFET, and a compressively-strained SiGe channel for a vertical pFET.

FIGS. 4A-4E illustrate a method of forming a semiconductor device (e.g., a CMOS device having a SiGe vertical channel) according to an exemplary aspect of the present invention.

Figure 4A:
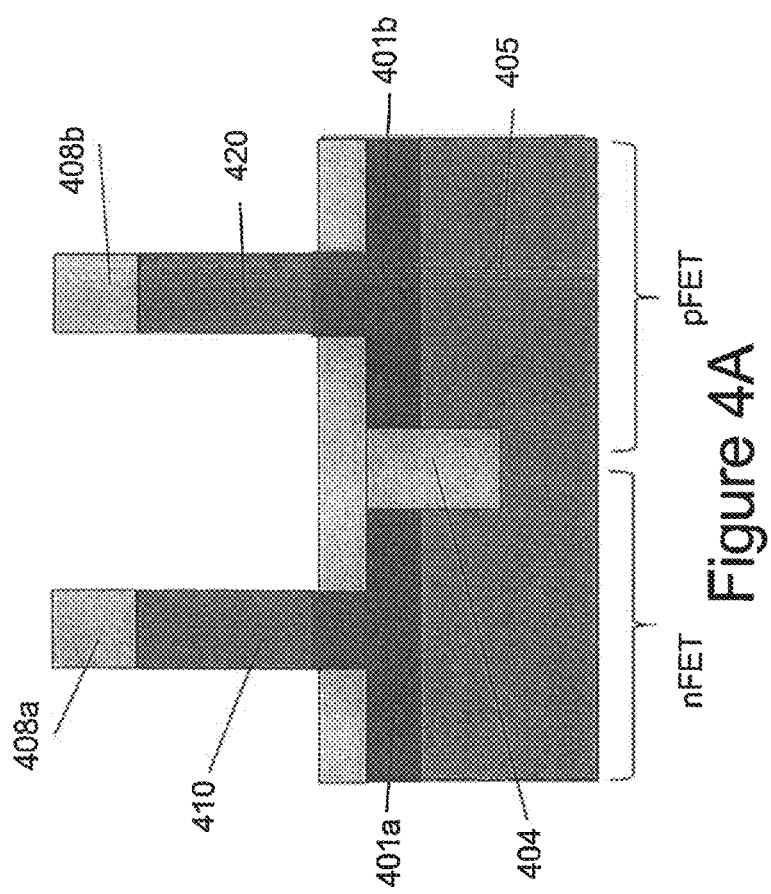
FIG. 4A illustrates a semiconductor device including a semiconductor substrate 405 (e.g., silicon) having an nFET side and a pFET side which are separated by an STI 404, according to an exemplary aspect of the present invention.

In particular, FIG. 4A illustrates a semiconductor device including a semiconductor substrate 405 (e.g., silicon) having an nFET side and a pFET side which are separated by an STI 404, according to an exemplary aspect of the present invention.

The semiconductor device may also include a bottom spacer 402 (e.g., a SiBCN layer having a thickness in a range of 3 nm to 7 nm), an n-type diffusion region 401*a* and a p-type diffusion region 401*b* (e.g., a bottom source/drain region), and a pair of SiGe fins (e.g., vertical channels) 410, 420 formed on the n-type and p-type diffusion regions 401*a*, 401*b*, respectively. A hard mask 408*a*, 408*b* (e.g., SiN) may be formed on the pair of SiGe fins 410, 420, respectively, for performing a patterning of the pair of SiGe fins 410, 420.

Figure 4B:
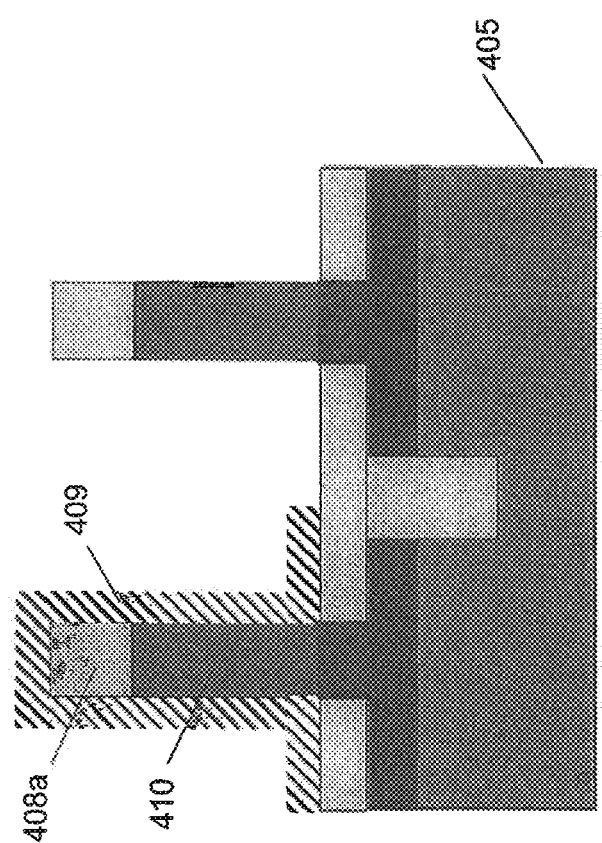
FIG. 4B illustrates forming a protective layer 409 (e.g., $SiO_2$) on the nFET side of the semiconductor substrate 405, according to an exemplary aspect of the present invention.

FIG. 4B illustrates forming a protective layer 409 (e.g., $SiO_2$) on the nFET side of the semiconductor substrate 405, according to an exemplary aspect of the present invention. The protective layer may include any layer (e.g., $SiO_2$) that can "protect" the SiGe fin 410 by keeping the germanium-containing layer from reacting with the surface of the SiGe fin 410.

As illustrated in FIG. 4B, the protective layer 409 may be formed by deposition (e.g., chemical vapor deposition (CVD), physical vapor deposition (PVD), atomic layer deposition (ALD), etc.). The protective layer 409 may have a thickness in a range from 1 nm to 5 nm, and may include an oxide such as $SiO_2$.

The protective layer 409 may be conformally formed on the SiGe fin 410 and the hard mask 408*a*. The protective layer 409 may be patterned to remove any portion from off of the pFET side of the substrate 405.

Figure 4C:
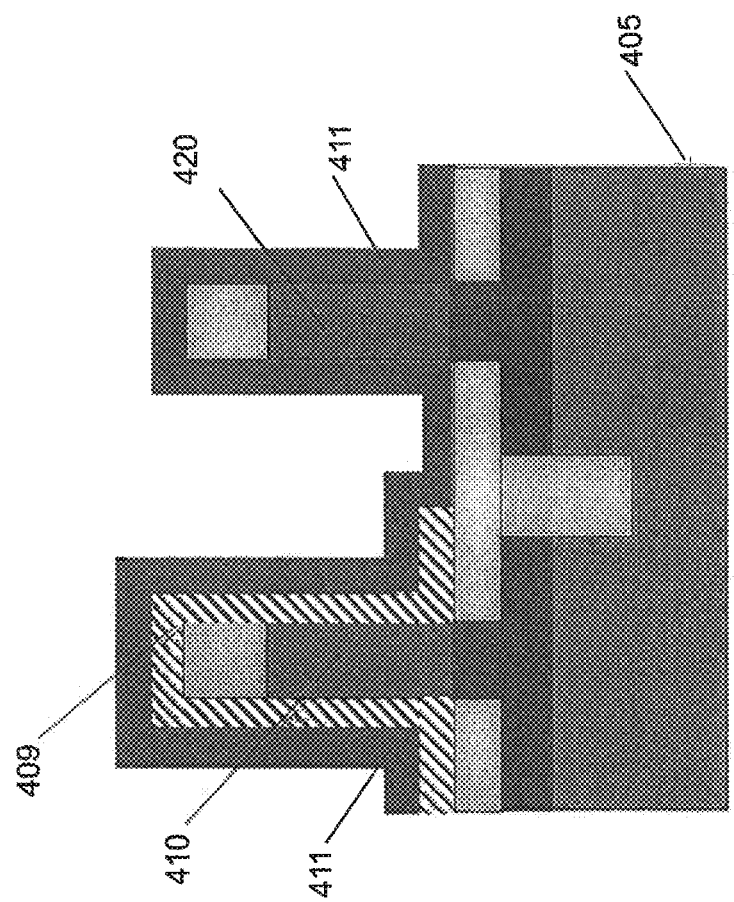
FIG. 4C illustrates forming a germanium-containing layer 411 on the nFET side and pFET side of the semiconductor substrate 405, according to an exemplary aspect of the present invention.

FIG. 4C illustrates forming a germanium-containing layer 411 on the nFET side and pFET side of the semiconductor substrate 405, according to an exemplary aspect of the present invention.

The germanium-containing layer 411 may include any layer that contains germanium (e.g., $GeO_2$) and may be reacted with the SiGe in the surface of the SiGe fin 420 so as to increase the ratio of germanium to silicon at the surface.

As illustrated on FIG. 4C, the germanium-containing layer 411 is formed on the protective layer 409 on the nFET side of the substrate 405, and on the surface of the SiGe fin 420 on the pFET side of the substrate 405.

The germanium-containing layer 411 may be conformally formed on the protective layer 409 and on the SiGe fin 420 and the hard mask 408*b*. The germanium-containing layer 411 may be formed by deposition (e.g., chemical vapor deposition (CVD), physical vapor deposition (PVD), atomic layer deposition (ALD), etc.). The germanium-containing layer 411 may have a thickness in a range from 1 nm to 5 nm, and may include, for example, $GeO_2$ (e.g., a $GeO_2$ layer).

Figure 4D:
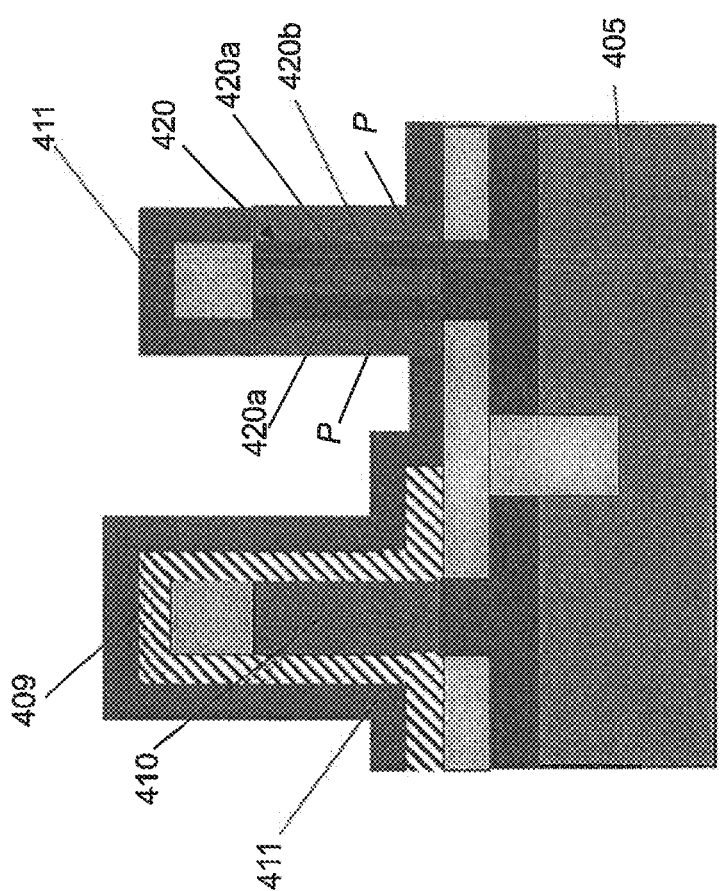
FIG. 4D illustrates the performing of an anneal, according to an exemplary aspect of the present invention.

FIG. 4D illustrates the performing of an anneal, according to an exemplary aspect of the present invention.

A temperature in the performing of the anneal may be no greater than 700° C., and a duration of performing the anneal may be in a range from 10 seconds to 1 minute (e.g., about 30 seconds). Further, the anneal may be performed in a nitrogen ambient.

After the performing of the anneal, the SiGe fin 420 may include a compressive strain in a vertical direction of at least 1 Gpa (e.g., 1.3 Gpa or more).

In performing the anneal, the germanium-containing layer 411 may react with the surface of the SiGe fin 420 such that the SiGe fin 420 includes the Ge-rich SiGe surface 420*a* having a Ge content which is at least 20% greater than a Ge content of a central portion 420*b* of the SiGe fin 420. For example, the Ge-rich SiGe surface 420*a* may include at least 40% Ge, and the central portion 420*b* may include no more than 20% Ge. The Ge content of the central portion 420*b* may be substantially equal to a Ge content of the SiGe fin 410 on the nFET side of the substrate 405.

Further, a thickness of the Ge-rich SiGe surface 420*a* may be in a range from 1 nn to 4 nm, and a thickness of the central portion 420*b* may also be in a range from 1 nn to 4 nm.

Further, in the performing of the anneal, the protective layer 420 protects the SiGe fin 410 and keeps the germanium-containing layer 411 from reacting with a surface of the SiGe fin 410. That is, the SiGe fin 410 may be substantially unchanged by the performing of the anneal.

In particular, in a case that the germanium-containing layer 411 includes a $GeO_2$ layer, in the performing of the anneal, the $GeO_2$ layer may react with germanium and silicon in the surface of the SiGe fin 420 according to the following two reactions:

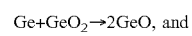

$Ge + GeO_2 \rightarrow 2GeO$, and

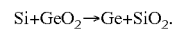

$Si + GeO_2 \rightarrow Ge + SiO_2$.

Thus, referring again to FIG. 4D, after the anneal, a product layer P (e.g., SiO2) may be formed on the Ge-rich SiGe surface 420*a*.

FIGS. 5A-5E illustrate an exemplary mechanism for reacting a $GeO_2$ layer (e.g., the germanium-containing layer 411) with a surface of the SiGe fin 420, according to an exemplary aspect of the present invention.

Figures 5A, 5B:
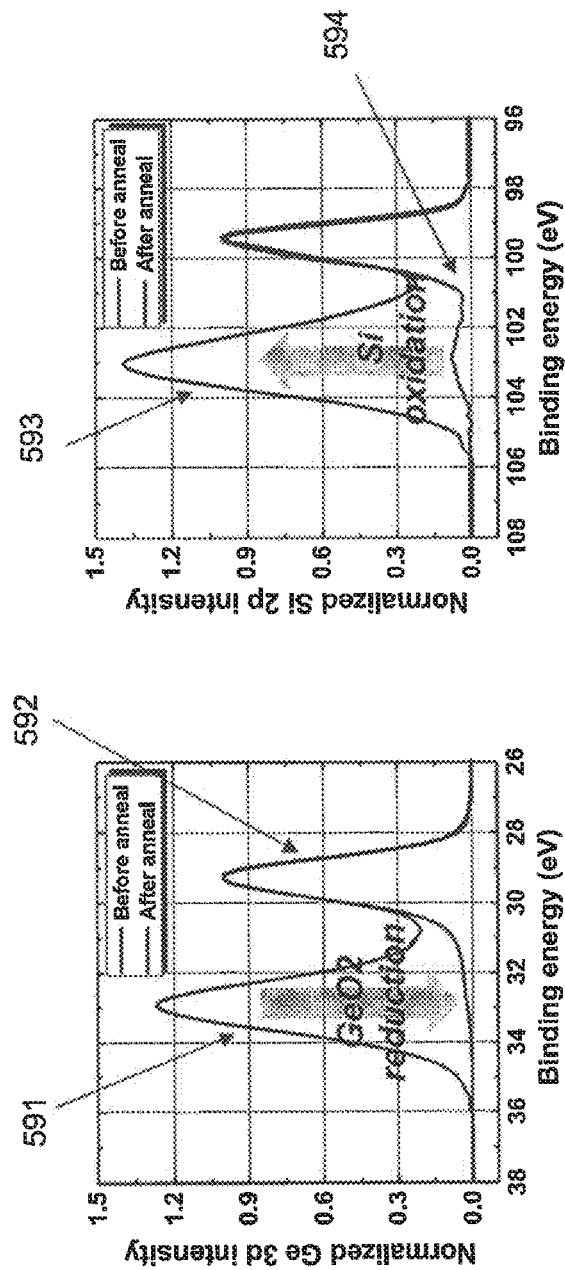
FIG. 5A illustrates a graph plotting binding energy v. normalized Ge 3d intensity, according to an exemplary aspect of the present invention.
FIG. 5B illustrates a graph plotting binding energy v. normalized Si2p intensity, according to an exemplary aspect of the present invention.

In particular, FIG. 5A illustrates a graph plotting binding energy v. normalized Ge 3d intensity, according to an exemplary aspect of the present invention.

As illustrated in FIG. 5A, the anneal causes a $GeO_2$ reduction, so that the after-anneal normalized Ge 3d intensity curve 592 is less than the before-anneal normalized Ge 3d intensity curve 591.

FIG. 5B illustrates a graph plotting binding energy v. normalized Si2p intensity, according to an exemplary aspect of the present invention.

As illustrated in FIG. 5B, the anneal causes a Si oxidation, so that the after-anneal normalized Si 2p intensity curve 594 is less than the before-anneal normalized Si 2p intensity curve 593

Figure 5C:
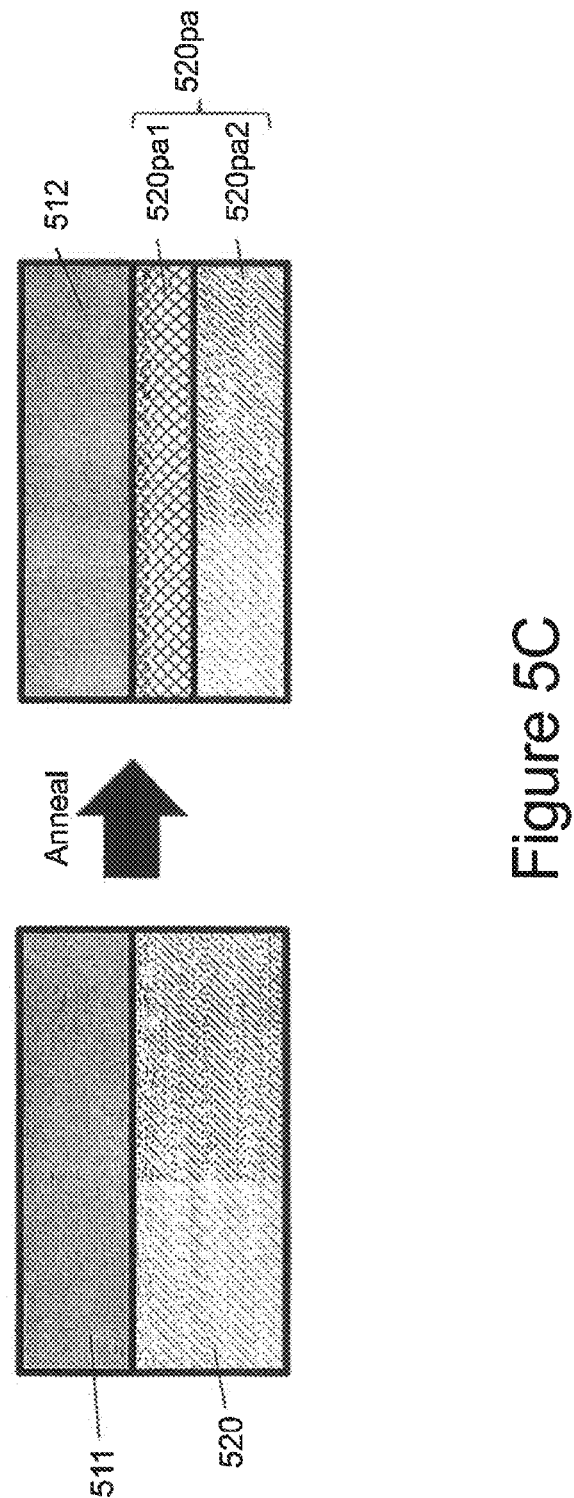
FIG. 5C illustrates an exemplary reaction in the performing of the anneal, according to an exemplary aspect of the present invention.

FIG. 5C illustrates an exemplary reaction in the performing of the anneal, according to an exemplary aspect of the present invention.

As illustrated in FIG. 5C, where a structure including a $GeO_2$ layer 511 formed on a SiGe layer 520 containing SiGe40%, is annealed, the result is a $SiO_2$ layer 512 on a post anneal layer 520*pa* including a SiGe60% surface portion 520*pa*1 and a SiGe40% portion 520*pa*2. It should be noted that a thickness of the post anneal layer 520*pa* is substantially equal to a thickness of the SiGe layer 520.

Thus, in the anneal, Si in the SiGe (e.g., the SiGe fin 420) may be selectively oxidized due to the lower Gibbs free energy. That is, an exemplary reaction at the surface of the SiGe40% layer 520 (e.g., SiGe fin 420 in FIG. 4D) is $Si+Ge+2GeO_2 \rightarrow Ge+2GeO+SiO_2$, where the product Ge is epi back (e.g., enriches the surface of the SiGe40% layer 520), the product 2GeO is a volatile species, and the SiO2 (e.g., oxide) is formed as a new layer.

Figure 6A:
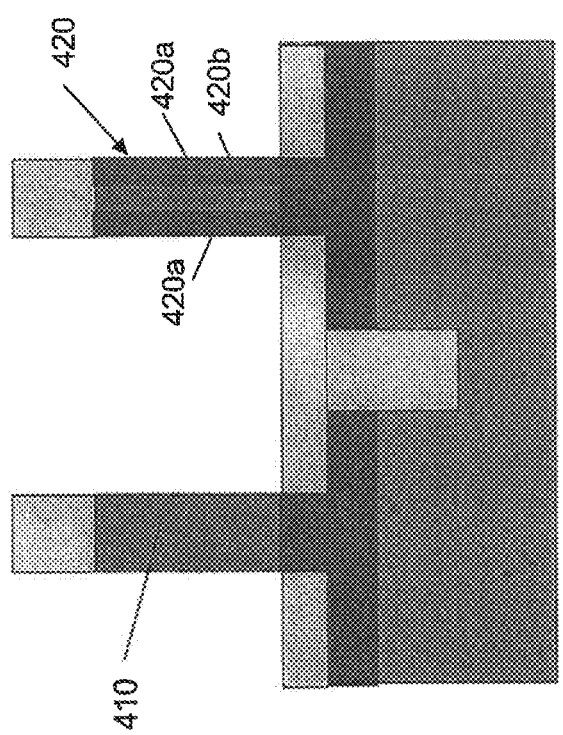
FIG. 6A illustrates removing an unreacted portion of the germanium-containing layer 411 and the protective layer 409, according to an exemplary aspect of the present invention.

FIG. 6A illustrates removing an unreacted portion of the germanium-containing layer 411 and the protective layer 409, according to an exemplary aspect of the present invention.

As illustrated in FIG. 6A, after the performing of the anneal, an unreacted portion of the germanium-containing layer 411 and the protective layer 409 may be removed from the SiGe fins 410, 420. In addition, any product from the reaction of the germanium-containing layer 411 which is formed on the Ge-rich SiGe surface 420*a* may be removed. For example, where the germanium-containing layer 411 includes $GeO_2$, the $SiO_2$ which is a product of the reaction of $GeO_2$ and SiGe (e.g., see FIG. 5C) may be removed.

For example, diluted HF may be used to remove the unreacted portion of the germanium-containing layer 411, the protective layer 420 and the reaction product on the surface of the SiGe fin 420.

FIG. 6B illustrates a detailed view of the SiGe fin 420 after the anneal, according to an exemplary aspect of the present invention.

As illustrated in FIG. 6B, a compressive strain in the vertical direction (Sc) may be formed in the Ge-rich SiGe surface 420*a*.

Figure 6C:
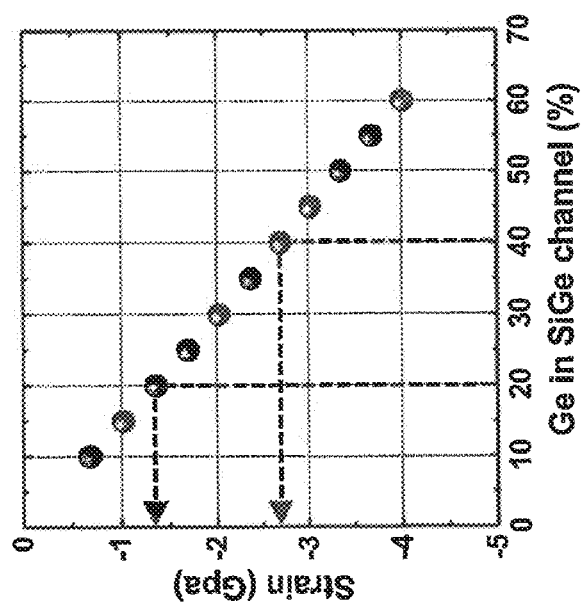
FIG. 6C is a graph plotting Ge in a SiGe channel vs. strain, according to an exemplary aspect of the present invention.

FIG. 6C is a graph plotting Ge in a SiGe channel vs. strain, according to an exemplary aspect of the present invention.

As illustrated in FIG. 6C, a compressive strain in a SiGe channel with only 20% Ge may be only about 1.3 GPa, whereas a compressive strain in a SiGe channel with 40% Ge may be about 2.6 GPa. Thus, for example, where the SiGe fin 420 is formed of SiGe with 20% Ge, the performing of the anneal may increase the compressive strain in the SiGe fin 420 by about 1.3 Gpa to improve the hole mobility in in the SiGe fin 420 (e.g., a pFET SiGe fin), while the SiGe fin 410 maintains a tensile-strained SiGe channel.

With its unique and novel features, the exemplary aspects of the present invention may provide a semiconductor device with a first SiGe fin having a tensile strain, and a second SiGe fin having a compressive strain in a vertical direction.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device comprising:
   a first diffusion region having a first conductivity type;
   a first SiGe fin including a vertical channel formed on the first diffusion region;
   a second diffusion region having a second conductivity type; and
   a second SiGe fin formed on the second diffusion region and comprising:
   a central portion of the second SiGe fin comprising a first amount of Ge; and
   a surface portion of the second SiGe fin comprising a second amount of Ge which is greater than the first amount,
   wherein a total width of the central portion and the surface portion is substantially equal to a width of the second diffusion region.

2. The semiconductor device of claim 1, wherein the first diffusion region is formed on a substrate and includes a first projecting portion,
   wherein the first SiGe fin is formed on the first projecting portion of the first diffusion region and comprises the first amount of Ge,
   wherein the second diffusion region is formed on the substrate and includes a second projecting portion,
   wherein the second SiGe fin is formed on the second projecting portion of the second diffusion region,
   wherein the second amount of Ge is at least 20% greater than the first amount of Ge, and
   wherein a thickness of the surface portion is substantially equal to a thickness of the central portion,
   wherein the first SiGe fin and the second SiGe fin each include a compressive strain in an x-direction and a y-direction, and includes a tensile strain in a z-direction.

3. The semiconductor device of claim 2, wherein the surface portion of the second SiGe fin comprises at least 40% Ge.

4. The semiconductor device of claim 2, wherein the central portion of the second SiGe fin comprises no more than 20% Ge.

5. The semiconductor device of claim 2, wherein a height of the first SiGe fin in a vertical direction is substantially equal to a height of the second SiGe fin in the vertical direction, and a width of the first SiGe fin in a horizontal direction is equal to a width of the second SiGe fin in the horizontal direction.

6. The semiconductor device of claim 2, wherein a thickness of the surface portion of the second SiGe fin is in a range from 1 nm to 4 nm.

7. The semiconductor device of claim 2, wherein the first SiGe fin comprises a tensile strain.

8. The semiconductor device of claim 2, wherein the second SiGe fin comprises a compressive strain in a vertical direction of at least 1 Gpa.

9. The semiconductor device of claim 2, further comprising:

an nFET and a pFET, the first SiGe fin comprising a fin of the nFET and the second SiGe fin comprising a fin of the pFET.

10. The semiconductor device of claim 2, further comprising:
a bottom spacer formed on the first and second diffusion regions, the first and second projecting portions projecting through the bottom spacer and contacting the first and second SiGe fins, respectively,
an nFET and a pFET, the first SiGe fin comprising a fin of the nFET and the second SiGe fin comprising a fin of the pFET, and
wherein the second SiGe fin comprises a compressive strain in a vertical direction of at least 1 Gpa.

11. A semiconductor device comprising:
a first diffusion region having a first conductivity type;
a first SiGe fin formed on the first diffusion region and comprising a first amount of Ge which is no more than 20% Ge;
a second diffusion region having a second conductivity type; and
a second SiGe fin formed on the second diffusion region and comprising:
a central portion of the second SiGe fin comprising the first amount of Ge; and
a surface portion of the second SiGe fin comprising a second amount of Ge which is at least 20% greater than the first amount,
wherein a total width of the central portion and the surface portion is substantially equal to a width of the second diffusion region.

12. The semiconductor device of claim 11, wherein the surface portion of the second SiGe fin comprises at least 40% Ge,
wherein a thickness of the surface portion is substantially equal to a thickness of the central portion,
wherein the first SiGe fin and the second SiGe fin each include a compressive strain in an x-direction and a y-direction, and includes a tensile strain in the z-direction.

13. The semiconductor device of claim 11, wherein a thickness of the surface portion of the second SiGe fin is in a range from 1 nm to 4 nm.

14. The semiconductor device of claim 11, wherein the first SiGe fin comprises a tensile strain.

15. The semiconductor device of claim 11, wherein the second SiGe fin comprises a compressive strain in a vertical direction of at least 1 Gpa.

16. The semiconductor device of claim 11, further comprising:
an nFET and a pFET, the first SiGe fin comprising a fin of the nFET and the second SiGe fin comprising a fin of the pFET.

17. The semiconductor device of claim 11, further comprising:
an nFET and a pFET, the first SiGe fin comprising a fin of the nFET and the second SiGe fin comprising a fin of the pFET,
wherein the first and second diffusion regions comprise a bottom source/drain (S/D) region formed on a substrate, the first and second SiGe fins being formed on a bottom S/D region, and
wherein the first SiGe fin comprises a tensile strain.

18. The semiconductor device of claim 17, further comprising:
a bottom spacer formed on the bottom S/D region; and
a shallow trench isolation formed in the substrate between the first SiGe fin and the second SiGe fin, the bottom spacer being formed on the shallow trench isolation.

19. A method of forming a semiconductor device, the method comprising:
forming a first diffusion region having a first conductivity type;
forming a first SiGe fin on the first diffusion region;
forming a second diffusion region having a second conductivity type; and
forming a second SiGe fin on the second diffusion region, the second SiGe fin comprising:
a central portion comprising a first amount of Ge; and
a surface portion comprising a second amount of Ge which is greater than the first amount,
wherein a total width of the central portion and the surface portion is substantially equal to a width of the second diffusion region.

20. The method of claim 19, wherein the first diffusion region is formed on a substrate and includes a first projecting portion,
wherein the first SiGe fin is formed on the first projecting portion of the first diffusion region and comprises the first amount of Ge,
wherein the second diffusion region is formed on the substrate and includes a second projecting portion,
wherein the second SiGe fin is formed on the second projecting portion of the second diffusion region,
wherein the second amount of Ge is at least 20% greater than the first amount,
wherein the first and second diffusion regions comprise a bottom source/drain (S/D) region formed on the substrate, the first and second SiGe fins being formed on the bottom S/D region, and
wherein the first SiGe fin comprises a tensile strain,
wherein a thickness of the surface portion is substantially equal to a thickness of the central portion,
wherein the first SiGe fin and the second SiGe fin each include a compressive strain in an x-direction and a y-direction, and includes a tensile strain in the z-direction.

* * * * *